United States Patent [19]

Corderman et al.

[11] Patent Number: 5,291,937
[45] Date of Patent: Mar. 8, 1994

[54] METHOD FOR PROVIDING AN EXTENSION ON AN END OF AN ARTICLE HAVING INTERNAL PASSAGEWAYS

[75] Inventors: Reed R. Corderman, Wyoming; Kevin G. McAllister, Fairfield, both of Ohio; Brian J. McAndrews, Milford, N.H.; John W. Locher, Sterling, Mass.

[73] Assignee: General Electric Company, Cincinnati, Ohio

[21] Appl. No.: 922,303

[22] Filed: Jul. 30, 1992

[51] Int. Cl.$^5$ ............................................ B22D 19/10
[52] U.S. Cl. .............................. 164/92.1; 164/122.1; 29/889.1
[58] Field of Search ................ 164/92.1, 122.1, 122.2; 29/889.1, 402.07, 402.18

[56] References Cited

U.S. PATENT DOCUMENTS

| | | | |
|---|---|---|---|
| 3,752,221 | 8/1973 | Copley et al. | 164/361 |
| 4,637,448 | 1/1987 | Burke et al. | 164/499 |
| 4,714,101 | 12/1987 | Terkelsen | 164/122.2 |

Primary Examiner—Kuang Y. Lin
Attorney, Agent, or Firm—Jerome C. Squillaro; Carmen Santa Maria

[57] ABSTRACT

An extension is provided on an end of an article having internal passageways and having a directionally oriented microstructure by using the article end as a growth seed in a molten material compatible with material from which the article end is made. The extension is directionally solidified as integral with and as an extension of the article end and with a microstructure compatible with that of the article end.

6 Claims, 4 Drawing Sheets

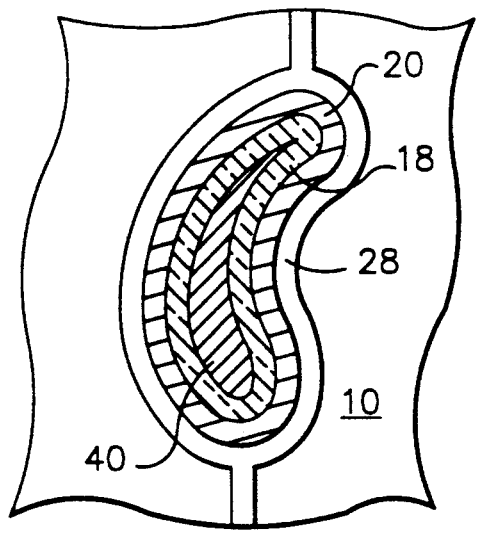
FIG. 2
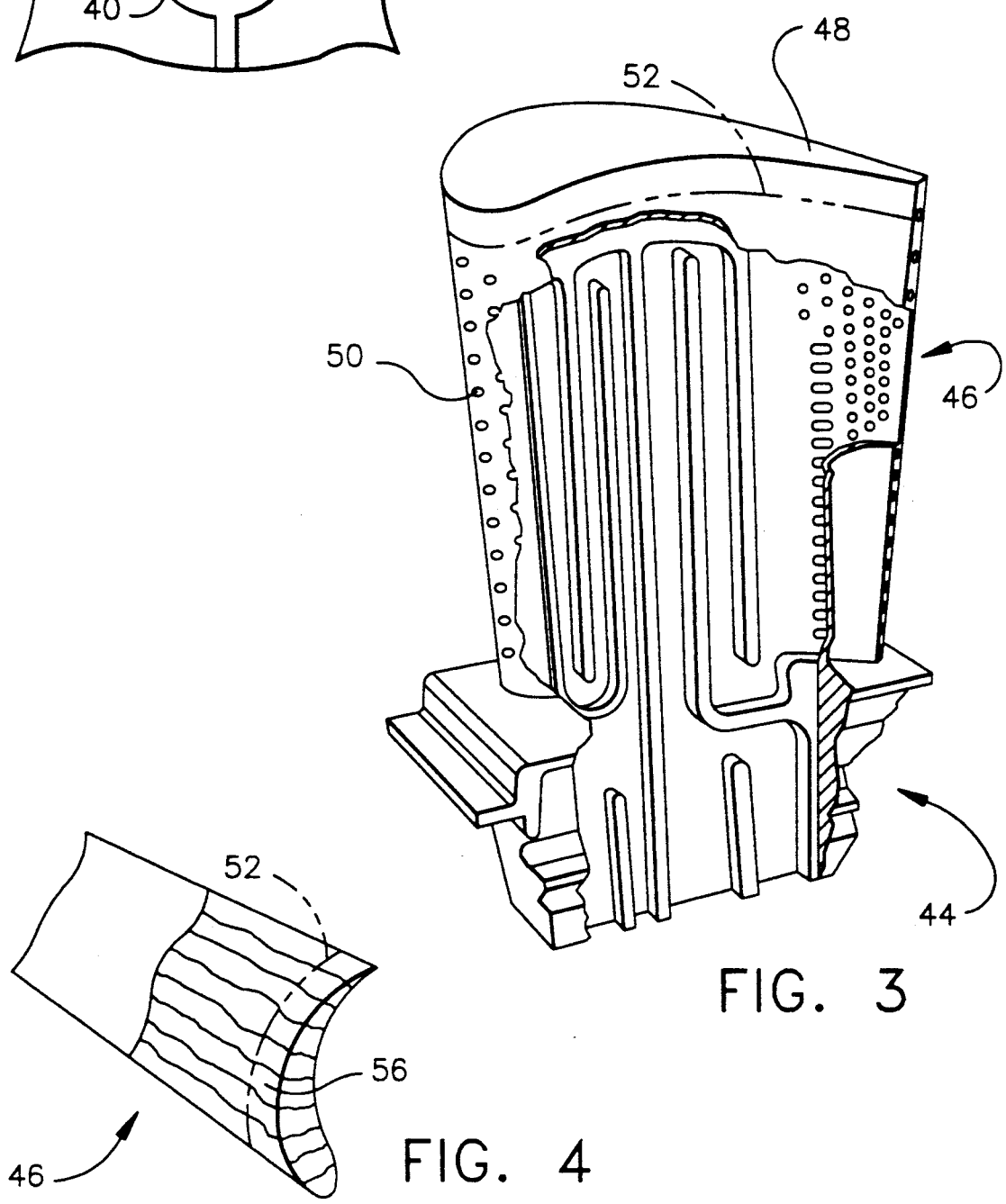
FIG. 3
FIG. 4

METHOD FOR PROVIDING AN EXTENSION ON AN END OF AN ARTICLE HAVING INTERNAL PASSAGEWAYS

CROSS REFERENCES TO RELATED APPLICATIONS

The following application is directed to related subject matter and is being concurrently filed with the present application, the disclosure of which is being incorporated by reference: Ser. No. 07/922,447 filed Jul. 30, 1992.

BACKGROUND OF THE INVENTION

This invention relates to growing an extension an end of an article having internal passageways and having a directionally oriented microstructure, and, more particularly, to such a method in which the end is used as a growth seed for the extension and article extended thereby.

The reported technology for growing directionally oriented structures from a molten bath of a selected material has evolved from simple shapes and members to complex shaped articles. A portion of such technology includes the generation in a complex shaped mold of directionally solidified alloy articles for use in the hot sections of gas turbine engines. The published literature well known to those skilled in such art has many examples of articles such as turbine blades and vanes provided in such a manner.

When an article, for example a turbomachinery or gas turbine engine blading member, is operated in an environment of airborne particles and particularly in the strenuous high temperature oxidizing and/or corrosive conditions experienced in the turbine section of a gas turbine engine, oxidation, hot corrosion, erosion, wear, low-cycle fatigue cracking and other damage can occur to such an article. Because the manufacture of such article is expensive, it is desirable economically to repair rather than to replace the article.

An example of a complex shaped blading member of the type referred to above is the turbomachinery blade described in U.S. Pat. No. 4,010,531—Andersen et al., patented Mar. 8, 1977 and assigned to the assignee of this invention. Such a blade includes a complex hollow interior communicating with an open tip for cooling purposes. The disclosure of such patent is hereby incorporated herein by reference.

Through the use of the above referred to reported technology, an article such as a blading member can be manufactured as a single crystal or with a directionally solidified microstructure of elongated grains. The combination of casting mold technology and casting procedures enables such manufacture. As is well known in the art of blading members, the characteristic crystal orientation in nickel-base superalloys frequently used for blading members is that the <001> crystallographic direction lies substantially parallel to the growth direction; designers of such blading members can utilize that characteristic crystal orientation to minimize the elastic modulus, and therefore reduce the likelihood of mechanical failure due to a mechanism such as thermal fatigue, along a specified direction relative to the configuration of an article such as a blading member.

When such a complex shaped article having a directionally oriented microstructure is damaged, either in operation or in a portion of its manufacturing procedure, the problem of its repair becomes more complicated and difficult. This problem of repair becomes particularly acute when a directionally oriented structure is intended to be maintained in the repaired portion, as is typically desired in directionally oriented articles such as airfoils, for example, blading members.

SUMMARY OF THE INVENTION

The present invention, in one form, describes a method for providing an extension on an end of an article having internal passageways and having a directionally oriented microstructure, from a molten material. The extension is grown using the end of the article as a directionally oriented microstructure growth seed for the molten material which is compatible with the article-seed structure. In one form of the present invention, the extension is grown by providing a shaping member, for example, a die having a die opening, communicating with the molten material. Fluid pressure applied to the molten material forces it into the die opening where it is contacted by the article-seed for a time sufficient for the seed to interact with the molten material, for example, melting back a portion of the seed or enabling interdiffusion to occur. Then the article end, acting as the growth seed, is withdrawn through the die opening at a rate which allows the molten material to directionally solidify on the growth seed as an extension of and integral with the article end. Also, it has a directionally oriented microstructure compatible with the article's directionally oriented microstructure.

In another form, the die includes a hollow die extension which is in communication with the molten material. The article end is held in the die extension for contact with the molten material forced therein.

In yet another form, the present invention provides an article comprising a body portion having internal passages or passageways and having a directionally oriented body or first crystal structure and a metallurgical structure and an extension integral with an end of the body portion through the use of a sacrificial addition secured to the end of the article prior to forming the extension. The extension has a directionally oriented crystal structure compatible with and extending continuous with the body portion crystal structure. In addition, the extension has a metallurgical structure compatible with and metallurgically distinguishable from the body's metallurgical structure.

BRIEF DESCRIPTION OF THE DRAWINGS

FIG. 2 is a fragmentary, partially sectional view taken along line 2—2 of FIG. 1, illustrating the cross-section of a shaping die of an airfoil shape.

FIG. 3 is a diagrammatic presentation of an air cooled gas turbine engine turbine blade.

FIG. 4 is a fragmentary diagrammatic view of a repaired airfoil, shown with an extension and multiple elongated grains.

DETAILED DESCRIPTION OF THE PREFERRED EMBODIMENTS

Figure 1:
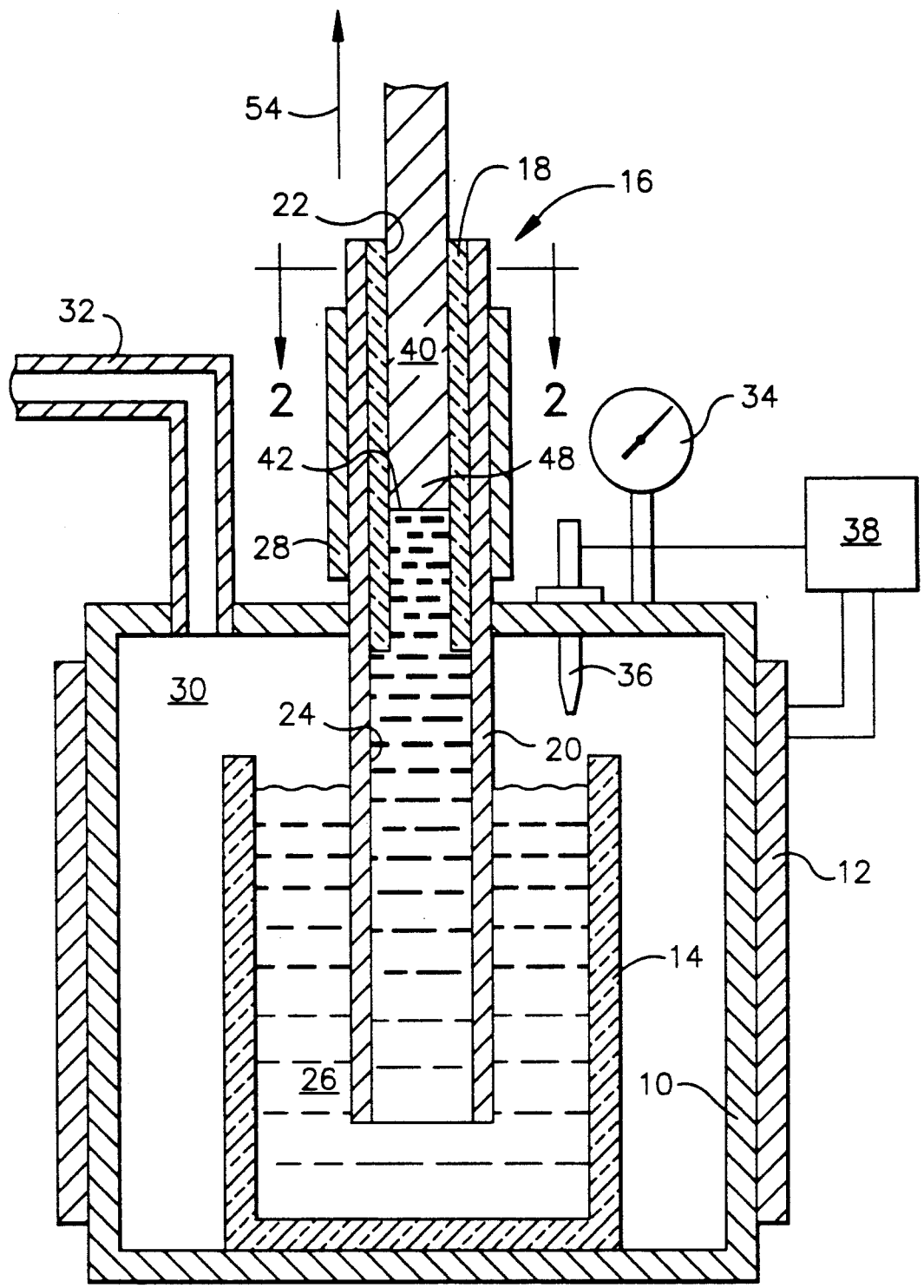
FIG. 1 is a sectional view of apparatus adapted to practice the method of the present invention.

In the art of casting, fluid pressure, such as an inert gas or air, has been applied within a closed container to a molten material, such as a metal, to force the molten material upwardly through a tube. A patent which discloses one such method and associated apparatus is U.S. Pat. No. 3,302,252—Woodburn, Jr., patented Feb. 7, 1967, relating to continuous casting of an article upwardly through a pouring tube into a cooled mold. The cast article is continuously withdrawn from the mold.

Another portion of the casting art sometimes is referred to as the EFG (Edge-defined, Film-fed Growth) process. In that process, no external pressure is applied to a liquid material, but capillary action within a narrow forming tube or die is relied upon to draw the liquid material upwardly for solidification. Frequently a seed crystal is introduced into the liquid to initiate crystal growth. Typical patents which disclose features of this kind of process include U.S. Pat. No. 3,471,266—La Belle, Jr., patented Oct. 7, 1969; U.S. Pat. No. 4,120,742—Asano et al., patented Oct. 17, 1978; and U.S. Pat. No. 4,937,053—Harvey, patented Jun. 26, 1990.

In some of the above referenced patents and elsewhere in the casting art relating to the formation of directionally solidified or single crystal articles, seed crystals having selected crystal orientations (primary alpha and/or secondary beta orientations) have been used. They constitute starter means for solidification of an article having the selected crystal orientation.

Heretofore, the joining of components of single crystal or directionally solidified elongated grain articles, including turbomachinery airfoils, has generally involved the use of separately cast members of selected crystal orientation. Such members are assembled and bonded into an article across an interface between the members. U.S. Pat. Nos. 3,967,355 and 4,033,792—Giamei et al. are typical of patents relating to this type of bonding; they include showing an attempt to match crystal structures across the bond interface.

The method of the present invention provides a new combination of steps which casts or grows an extension directly on an end of an existing article to enable repair. Through use of the article itself as the seed or starter means, the extension is provided with a crystal microstructure including orientation, matched with and continuous with that of the article. In addition, in one form, the extension has a metallurgical structure generally distinguishable from the metallurgical structure of the article end or body, from which the extension is grown. As used herein, the term "crystal structure" is intended to mean the overall crystal form such as a single crystal, multiple elongated grains, etc. and the directional orientations thereof. The term "metallurgical structure" herein is intended to include such characteristics as overall chemical or alloy composition, and the size, shape, spacing and composition of precipitates, phases, inclusions, dendrites, etc. within the crystal structure. For example, Ni-base superalloys generally include gamma prime precipitates, spaced dendrite arms and various other distinguishable phases. The crystal structure and metallurgical structure can be determined and identified by a variety of known and widely used techniques including chemical or spectrographic analysis and various x-ray and photomicrographic methods. The term "microstructure" herein includes the terms crystal structure and metallurgical structure.

This method eliminates the need to provide a separate member as an article extension, to match the extension member crystal orientation with the article to be repaired, and then to bond the extension in the proper orientation to a portion of the article as shown in the above identified U.S. Pat. Nos. 3,967,355 and 4,033,792. The method of this invention accomplishes all such steps in one operation, providing the extension integral and oriented with the article. As will be discussed in detail below, the present invention is particularly useful in providing an extension on an article having a hollow interior and openings or passages communicating through an end of the article with the hollow interior.

One form of the method of the present invention allows use of a sacrificial addition on an end of the article to be repaired to minimize interaction, such as melt back, of the article end with a molten material from which the article extension is grown. Furthermore, because the damaged article end in the present invention interacts directly with the molten material, such as in melt back, the need to pretreat or preshape or remove substantial material from the end can be substantially reduced or eliminated During evaluation of the present invention, apparatus of the type shown in FIG. 1 was used. A sealed molybdenum canister 10, in this example of circular cross section, is provided with a resistance heater 12 of molybdenum. Within canister 10 is an alumina melt crucible 14. Through the top of canister 10 is a shaping member or die assembly shown generally at 16, in this embodiment including a shaping die 18 and a die extension 20. The die and the extension each have an inner wall, 22 and 24, respectively, defining hollow interiors thereof and die and die extension or shaping openings for receiving a molten material 26 from melt crucible 14. The die and die extension are made of alumina, commonly used in the high temperature casting art, and have cross sectional shapes matched with, but not necessarily identical to, the cross sectional shape of the article to be treated. The die extension 20 is typically made from either commercially available high-purity polycrystalline aluminum oxide (alumina) tubing or commercially available single crystal alumina (sapphire) tubing available from Saphikon Inc., Milford N.H. The shaping die 18 is typically made from commercially available high purity low shrinkage short-fiber alumina paper sheet material. Alumina cement such as ZPI-306 alumina cement available from Zircar Products, Florida N.Y. was used to cement lapped joints and highly deformed areas such as corners and bends in the alumina sheet material. The alumina cement is a mixture of short alumina fibers and small alumina particles with a small fraction of an unspecified organo-aluminum compound (probably aluminum diacetate or subacetate) which serves as a binder in the unfired state. A high-purity castable alumina ceramic was used to provide a curved bottom surface to the melt pool in the shaping die 18. Airfoil die tops were made by forming and cementing the outer wall from alumina paper sheet in the appropriate shape, and then casting either a polycrystalline or a single crystal sapphire tube in place in the bottom with the castable alumina ceramic material. The die then comprised a die extension tube 20 feeding a shallow, approximately 0.6 inch deep, resevoir of the desired shaping die 18 shape. Fabrication procedures for die assemblies 16 using the castable ceramic consisted of overnight curing in a plastic bag to prevent non-uniform drying, a two-hour sbakeout at 100°-300° C. (212°-572° F.), preferably at about approximately 110 degrees Centigrade (230° F.), and a one-hour firing at 900°-1200° C. (1652°-2192° F.), preferably at about 1000 degrees Centigrade (1832° F.) to fully cure the ceramic. Surrounding die assembly 16 is a molybdenum resistance heater 28 to assist in control of the condition of the molten material 26 as it moves and solidifies within the hollow interior of die 18.

In order to pressurize the sealed interior 30 of canister 10, a fluid pressure inlet tube 32, connected to a source of fluid pressure (not shown), such as argon, is disposed through a wall of the canister. Sensing the pressure within the canister interior is a pressure gage 34, which can provide pressure data to a pressure control (not shown) for the source of fluid pressure, to maintain pressure at a desired, preselected level, or schedule of levels, within canister 10. Temperature sensing within canister interior 30 employs a thermocouple 36. Through a furnace temperature control 38, electric power to resistance heaters 12 and 28 is controlled and scheduled as desired.

The partially sectional, fragmentary view of FIG. 2 is taken along line 2—2 of FIG. 1. This figure, in which the meaning of the reference numerals coincide with those of FIG. 1, shows the shaping die 18, the die extension 20 and the die resistance heater 28. Each of these elements has an airfoil shaped cross section in FIG. 2, which corresponds with the shape of airfoil article 40, in FIG. 1. However, it is to be understood that these cross sections may assume any desired shape as may be necessary for the intended repair. An extension is being grown on the airfoil article 40 at solidification interface 42 in FIG. 1. However, it should be understood that any shapes or assemblies of shapes can be used for such members, depending on the shape of the article being extended and the desired shape of the extension.

In one of the evaluations of the present invention, a gas turbine engine turbine blade, of the general type shown diagrammatically in FIG. 3, was used. Such a blade included a base shown generally at 44, an airfoil shown generally at 46 and a blade tip 48. The blade had a hollow interior for air cooling with cooling holes or passages such as 50 communicating with the hollow, generally labyrinthine, interior. Because such a blade had a directionally solidified microstructure, including a crystal structure as elongated multiple grains, repair of damage to tip 48 is difficult if such microstructure is to be continued into the repair. The present invention enables growth on the blade tip of an extension having a microstructure of crystal structure and metallurgical structure grown from and compatible with the parent blade tip. In this evaluation, it was desired to repair the tip portion 48 of the airfoil 46 of FIG. 3 axially outwardly from broken line 52. The material from which such blade was cast was a nickel base superalloy having a nominal composition, in weight percent, of 6.15% Al, 6.35% Ta, 4.9% W, 2.8% Re, 12% Co, 6.8% Cr, 1.5% Hf, with the balance Ni, selected minor alloy additions and incidental impurities. The microstructure of such cast blade was directionally oriented multiple elongated grains.

Another, though similar, nickel base superalloy was placed in melt crucible 14, FIG. 1, within canister 10 which was then sealed. The nickel base superalloy in melt crucible 14 had a nominal composition, in weight percent, of 6.7% Al, 6.2% Ta, 2% Re, 10.5% Co, 16% Cr, 1.6% Hf, with the balance Ni, selected minor alloy additions and incidental impurities. The superalloy was melted by resistance heater 12 at a temperature in the range of about 2790° to 2905° F. under a low-oxygen argon atmosphere. With the die assembly 16, including shaping die 18 and die extension 20, in position as shown in FIG. 1, the melt was pressurized by introducing argon under pressure through fluid pressure inlet tube 32. At a pressure of about 48 inches H$_2$O, the melt was moved upwardly in die extension 20 into shaping die 18. About 50.5 inches H$_2$O was a pressure sufficient to move melt 26 into contact with blade tip 48 where it was held for about 4 minutes. During that period, blade tip 48 interacted with melt 26 by melting back to solidification interface 42, FIG. 1, also shown as broken line 52, FIG. 3. Furthermore, the blade tip 48 acted as an oriented growth seed for melt 26 in die 18. Then airfoil article 40 and article end or blade tip 48 was withdrawn by moving upwardly, as shown by arrow 54, FIG. 1, at a rate of about 0.2 inches per minute. This allowed blade tip 48 to solidify in die 18 and grow an extension having the same directionally solidified multiple elongated grain crystal structure as airfoil blade tip 48. The extension was continuous and integral with the blade tip. Withdrawal and directional solidification was continued until an extension of about 0.4" was provided in the same configuration and crystal structure orientation as blade tip 48.

During this process, die heater 28 was used to control the temperature in die assembly 16 and the position of solidification interface 42. Further control of the solidifying interface can be accomplished using a chill in that location, not shown, as is well known and widely used in the directional solidification casting art. Such a chill can provide as steep a thermal gradient as is desired for selected solidification and microstructure growth.

Because the die assembly was made of alumina, the variation of melt depth across the airfoil shaped cross section of the die assembly was observed to be that as would be expected in a non-wetting system. This enabled positioning of the growth seed blade tip portion in the die so that contact with the entire tip, from leading to trailing edge, was accomplished.

As was presented in the example above, the composition of the blade tip alloy was different from that of the alloy of the extension grown on the tip from the melt. However, the two compositions were selected so that the crystal structure of the extension would grow integral with and continuous from that of the blade tip representing the body portion for the extension. This mode of growth is sometimes termed epitaxial growth. In the context of the present invention, this is generally a necessary condition for compatibility between the alloy of the blade tip (or body portion) and that of the extension. Compatibility generally implies that neither alloy adversely affect the other, whether by contamination, liquid metal embrittlement, formation of brittle phases at the interface, or otherwise. Compatibility may also imply some limitation on discontinuities in mechanical and physical properties and metallurgical structure between the blade tip and the extension. Ultimately, compatibility must be measured by performance. If extensions of one alloy can be repeatably grown on articles of another alloy, if the article with an extension grown thereon is amenable to subsequent manufacturing operations, and if the finished article performs satisfactorily in service, then it must be concluded that the two alloys are compatible, exceptions to the preceding generalities notwithstanding. The same considerations apply to sacrificial additions. As used herein, the phrase "molten material compatible with . . ." is taken to mean a material or alloy that meets the preceding standard for compatibility, present in its liquid form.

The article generated from practice of this invention included a body portion, for example, the parent blade tip having internal passageways and having a first crystal structure in the above example, directionally oriented elongated multiple grains, and a first metallurgical structure based on the alloy composition of the body portion. Integral and continuous with the body portion was an extension having a second crystal structure as a continuation of and compatible with the first crystal structure of the body portion and having a second metallurgical structure matched and compatible with, but distinguishable from, the first metallurgical structure of the body. The interface portion between the body and the extension is different from that obtained by the prior art method of diffusion bonding together matched, separately generated, distinct members. The principal distinction between the present invention and the prior art lies at the interface. In the present invention the extension is grown epitaxially by laying down one layer of atoms after another from the liquid material selected for the extension onto the surface of the body. Thus, the crystal structure is continuous across the interface. The process of the present invention further allows the secondary grain orientation to be grown, unlike the prior art interface bonding techniques for which such secondary grain orientation is difficult to match in the transverse direction. The epitaxial grown region or repaired area thus matches the original metallurgical grain structure or orientation of the article not only in the primary, but also the secondary, direction. The advantage over current repair methods which have equiaxed grains at the interface and in the repaired area is significant in terms of mechanical and metallurgical properties since the metallurgical grain structure of the original article does not match the extension or repaired area by use of prior art methods. Even where different alloys are selected for the body and extension, there will generally be a gradation in metallurgical structure in the interface region as a result of rapid mixing of atomic species in the liquid adjacent to the solidified structure. Even though the prior art method is practiced with great care, there is a high likelihood of local surface irregularities and small misalignments between the body and a separate extension that may result in some sort of low angle boundary between the two parts. Likewise, there is a high likelihood that contaminating matter on either part will become trapped in the interface, thereby weakening the joint. Additonally, the prior art practices for repairing such an article usually and disadvantageously close the passageways as the molten metal flows into them and solidifies. Additional machining operations then are required to open the passageways.

The preceding example demonstrated that controlled growth of extensions, of the type that would be required in airfoil blade tip repair, with the same cross-section as the parent airfoil, can be accomplished. Although this example included only one end or tip extension, it should be understood that the present invention can be expanded to include the concurrent repair of multiple article ends such as blade tips. The present invention may also be used for repair of other directionally oriented articles having passageways such as airfoil vanes.

From this example it was concluded that the crystal structure of the extension should be substantially the same as that of the existing article. However, it was unexpectedly found that considerable variation in metallurgical structure, notably alloy composition, between the extension and existing article is permissible, and may even be preferable in some cases.

As a result of the practice of the present invention, the airfoil 46 of FIG. 3 includes an extension 56, FIG. 4, from broken line 52 at which it was desired to provide a repair. As seen in the fragmentary, diagrammatic view of FIG. 4, using airfoil 46 as a growth seed results in extension 56 having a compatible microstructure, in this example including multiple elongated grains, as a continuation of and integral with that of the parent airfoil.

Figure 5:
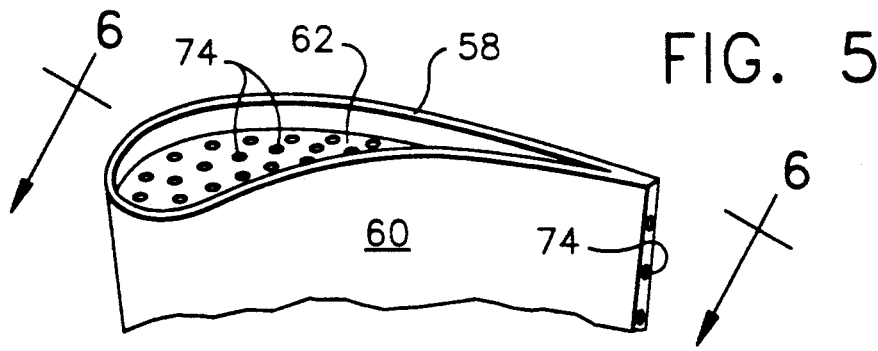
FIG. 5 is a fragmentary view of the blade tip portion of an air cooled gas turbine engine blade.
Figure 6:
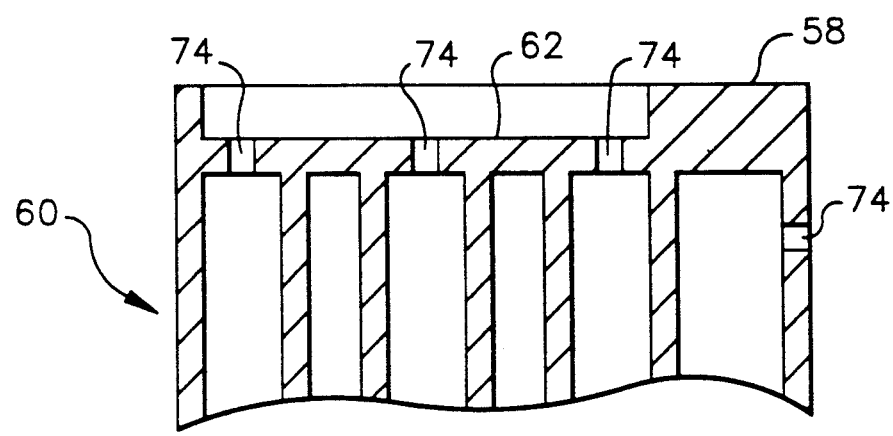
FIG. 6 is a fragmentary section view of a portion of the blade tip in FIG. 5, along line 6—6.

Another form of the tip portion of a gas turbine engine air cooled blade is shown in the fragmentary view of FIG. 5 and the sectional view of FIG. 6 taken along line 6—6 of FIG. 5. Sometimes this type of tip is referred to as a "squealer tip" because under certain operating conditions it can interfere with or rub on an opposing member to approach a zero clearance condition. As a result of such interference, peripheral rim 58, FIGS. 5 and 6, of airfoil 60 can be abraded or damaged. Even without such a rub condition, airborne particles and oxidation, over a period of operation, can abrade and contribute to the damage of rim 58. The method of the present invention can be used to repair such damage by providing an extension in the manner described in the above example. However, when rim 58 is narrow or damage extends close to shelf 62, interaction of rim 58, such as melt back in melt 26 in FIG. 1, should be limited and carefully controlled in order to avoid damage to shelf 62. One form of the method of the present invention provides use of a sacrificial addition carried by rim 58 at 64 in FIG. 7. The edge or surface 66 of rim 58 in FIG. 7 is represented to be eroded, damaged and in need of repair.

Sacrificial addition 64 need not have the same microstructure as the blade tip, for example, elongated multiple grains or a single crystal. All that is required is that it be attached to rim 58 and be of a material which is compatible with that of melt 26. For example, if melt 26 is a nickel base superalloy, addition 64 can be Ni, a Ni base alloy having elements which will not dilute or substantially change the composition of melt 26, an alloy of one of the alloying elements of melt 26, etc. Addition 64 can be applied by a variety of methods well known in the art, including flame Spraying, electrodeposition, diffusion bonding of a preformed member, etc., provided that the passageways are unaffected. If the passageways are affected, additional operations may be required to assure communication with the article interior. Also, because the sacrificial addition 64 will be melted away in melt 26 during practice of the method of this invention, the shape of addition 64 can be any convenient one: it can be shaped as an extension of rim 58 as shown in FIG. 7, it can be a shim, sheet or foil carried by rim 58, etc. The melting away of addition 64 by melt 26 exposes at least the surface microstructure of rim 58 to melt 26 enabling such surface to act as a growth seed, according to this invention. Use of a sacrificial addition 64 facilitates the proper positioning of airfoil article 40 in FIG. 1 so that when an article such as airfoil 60 in FIGS. 5, 6 and 7 is being repaired, the melt back line 68 in FIG. 7 is located away from rather than at or in shelf 62. Without such sacrificial addition, it might be required, in order to achieve complete contact of and interaction with melt 26, to melt back rim 58 into shelf 62.

Figure 8:
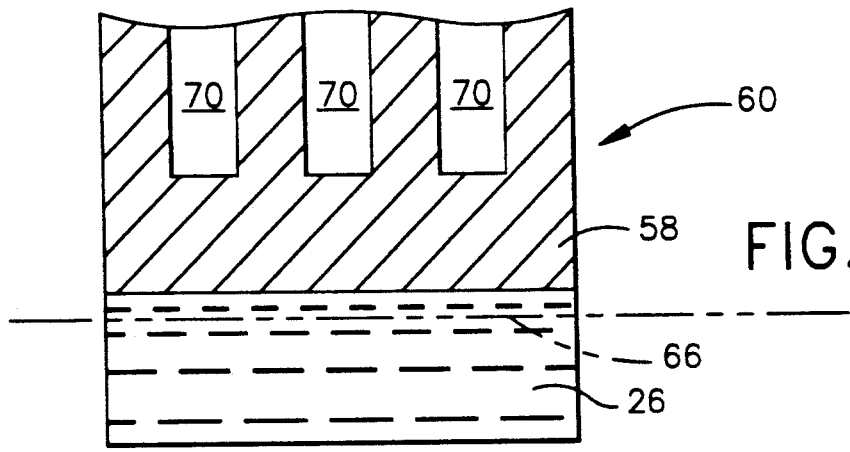
FIGS. 8, 9 and 10 are diagrammatic sectional views of the sequence of the practice of the method of the present invention on a hollow article.
Figure 9:
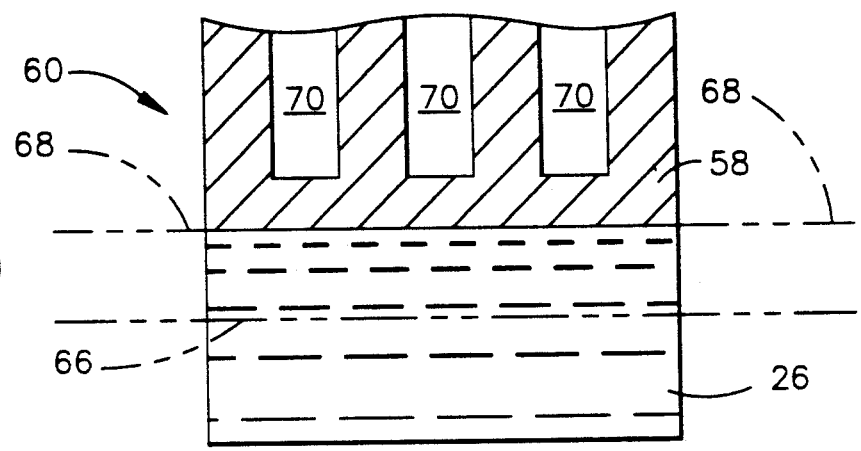
Figure 10:
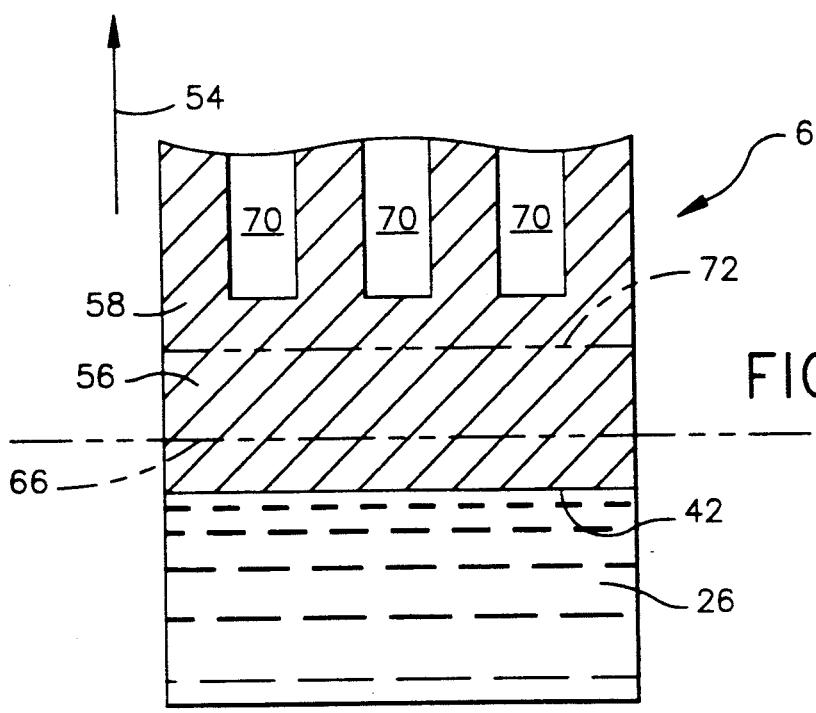

The presentation of FIGS. 8, 9 and 10, which are diagrammatically in section, show a sequence of the practice of the method of the present invention in a surrounding shaping die (not shown) as in FIG. 1, in relation to repair of an article having a hollow interior. For example, such interior can be the labyrinthine passages 70 in an air cooled turbine blade or vane. For convenience, some of the reference numerals are the same as have been used previously herein. FIG. 8 shows rim 58 in contact with and partially melted back by melt 26 from previous rim edge 66 shown in phantom. In FIG. 9, melt back has continued further into rim 58 to melt back line 68, sufficient for the remaining portion of rim 58 to act as a growth seed for melt 26. Then airfoil 60 is moved upwardly, as shown by arrow 54 in FIG. 10, while in contact with melt 26 until extension 56, delineated by broken line 72, is grown on rim 58 by solidification above melt line 68 which becomes solidification interface 42, as described above. If blade extension 56 is solid in some part, additional holes can be drilled therein to allow air egress or external communication with the hollow interior, as desired. For example, such holes can be generated by drilling with laser, electrochemical or electro discharge methods well known and widely used in the art of material removal.

Figure 7:
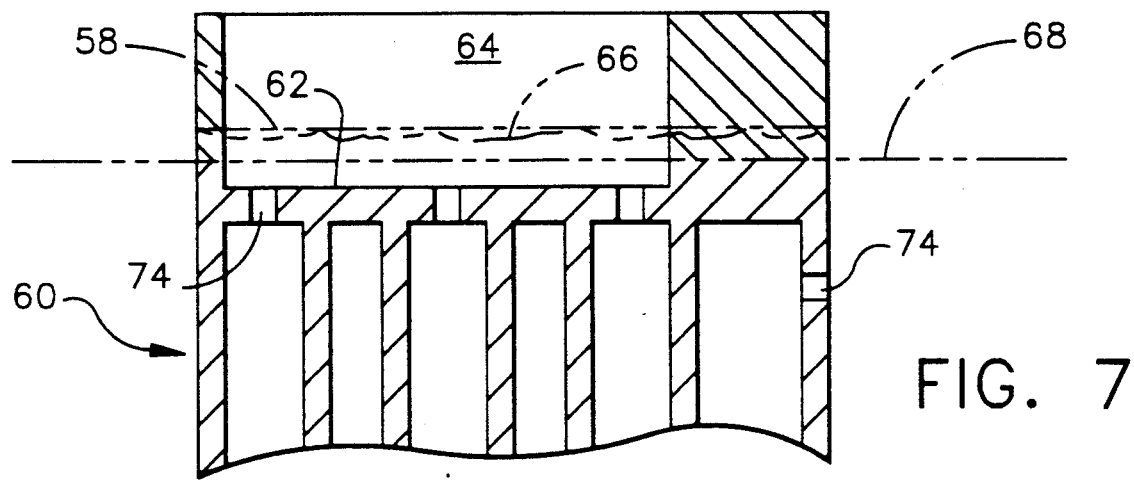
FIG. 7 is a fragmentary sectional view of a portion of the blade tip in FIG. 6, including a sacrificial addition.

One evaluation of the present invention used an air cooled turbine blade of the type shown in FIGS. 5, 6 and 7, and which had been exposed to gas turbine type operating conditions. The blade was manufactured from the same nickel base superalloy as in the previous example. This alloy includes in its composition Al and Hf, which when exposed to high temperature oxidizing conditions form stable surface oxides. Such alloying elements, and occasionally yttrium, are commonly used in nickel base superalloys from which turbine blades are manufactured. Therefore, the exposed surfaces of air cooling passages or holes, such as holes 74 in FIGS. 5, 6 and 7, were coated with surface oxides which were found not to interact with or melt in the molten material such as melt 26. Because such surfaces were oxides, they act as non-wetting molds. In this example, melt back was allowed to proceed into the blade material in which the holes were generated. Unexpectedly, very few of the holes were filled when contacted by melt 26, which had the same composition as the extension material of the previous example, and their integrity was maintained. However, in order to avoid such non-wetting action from affecting other portions of the blade tip which are intended to interact with the molten repair material, pre-treatment to remove oxides, coatings, etc., such as mechanical or chemical surface treatment, can be used to facilitate article extension growth. In one form of the method of the present invention the fluid pressure applied to the melt is selected to be adequate to move the melt into the shaping member but less than that required to force the melt into the oxide coated holes. Such pressure limit is a function of the size of the holes.

The present invention relates to using an article or member having at least one internal passageway as a directionally oriented growth seed for providing on an end of the member a distinguishable extension having a microstructure matched with that of the member. Such an extension is provided from a molten material which is compatible or matched with the material of the growth seed so that the extension is integral with the member and has a microstructure continuous with that of the member. However, as discussed above, the composition of the member and of the molten material, and hence the extension grown therefrom, need not be identical. Selection of the molten material, for example to provide the extension with enhanced environmental resistance, is based on the tolerable degree of crystal structure mismatch between the member, acting as a growth seed, and the extension, grown from the molten material. The rate of movement of the article end, acting as the growth seed, from the molten material is a function at least of the fluid pressure applied, the temperature of the melt, the thermal gradient at the solidifying interface and the rate of solidification and growth of the extension.

It is contemplated by the method of this invention that if a molten material has a melting point lower than that of the article end acting as a growth seed, interaction between the molten material and growth seed need not include complete melting of the growth seed article end. All that is necessary is that a condition exist at the interface to allow crystal structure growth across the interface and into the molten material.

The present invention has been described in connection with specific examples and embodiments, including those presented in the drawings. It should be understood, however, that these are intended to be representative of and not limiting on the scope of the present invention included within the appended claims.

We claim:

1. In a method for providing an extension on an end of an article having an outer cross-sectional shape, at least one passage defined by a wall through the article end communicating with a hollow interior, the article further having a directionally oriented microstructure and a superalloy chemical composition, the combination of steps of:

provviding a molten material having a superalloy chemical composition compatible with the article chemical composition;

providing a die having an internal wall defining a die opening therethrough matched in cross-section with the article outer cross-sectional shape;

providing a die extension having a hollow interior defined by an extension wall disposed between and in communication with the die internal wall on a first extension end and with the molten material on a second extension end;

applying fluid pressure to the molten material to force the molten material into the die extension hollow interior through the second extension end;

passing the article end through at least a portion of the die opening and into contact with the molten material;

holding the article end in contact with the molten material for a time sufficient for a portion of the article end to interact with the molten material as a directionally oriented microstructure growth seed; and then, withdrawing the article end through the die opening at a rate which allows the molten material to directionally solidify in the die opening on the growth seed as an extension of and integral with the article end and with a crystal structure substantially continuous with the article directionally oriented microstructure.

2. The method of claim 1 including the additional step, prior to passing the article end through the die opening portion, of securing with the article end a sacrificial addition of a material which is compatible with and will melt in the molten material to expose a surface of the article to the molten material.

3. The method of claim 1 for providing an extension on an end of an alloy article having an outer cross-sectional shape, a directionally oriented microstructure, a hollow interior, and at least one passage defined by a wall through the article end communicating with the hollow interior, wherein:
the molten material is an alloy; and
the fluid pressure is applied by a gas.

4. The method of claim 1 in which the wall of the passage includes thereon an oxide which inhibits the molten material from interacting with the wall of the passage.

5. The method of claim 4 in which the applied fluid pressure is sufficient to move the molten material into die opening but less than a pressure required to move the molten material into the passage.

6. In a method for providing an extension on an end of an airfoil, the airfoil having a base portion as a first end and an integral airfoil portion as a second end attached to the base portion first end, the airfoil second end having an outer cross-sectional shape, at least one passage defined by a wall through the airfoil second end communicating with a hollow interior, the airfoil further having a directionally oriented microstructure and a superalloy chemical composition, the combination of steps of:

providing a molten material having a superalloy chemical composition compatible with the article chemical composition;

providing a die having an internal wall defining a die opening therethrough matched in cross-section with the airfoil second end outer cross-sectional shape;

providing a die extension having a hollow interior defined by an extension wall disposed between and in communication with the die internal wall on a first extension end and with the molten material on a second extension end;

applying fluid pressure to the molten material to force the molten material into the die extension hollow interior through the second extension end;

passing the airfoil second end through at least a portion of the die opening and into contact with the molten material;

holding the airfoil second end in contact with the molten material for a time sufficient for a portion of the airfoil second end to interact with the molten material as a directionally oriented microstructure growth seed; and then, withdrawing the airfoil second end through the die opening at a rate which allows the molten material to directionally solidify in the die opening on the growth seed as an extension of and integral with the airfoil second end and with a crystal structure substantially continuous with the airfoil directionally oriented microstructure.

* * * * *